United States Patent [19]

Nusinov et al.

[11] Patent Number: 4,654,789
[45] Date of Patent: Mar. 31, 1987

[54] LSI MICROPROCESSOR CHIP WITH BACKWARD PIN COMPATIBILITY

[75] Inventors: Eugene Nusinov, North Andover; John J. Bradley, Framingham, both of Mass.

[73] Assignee: Honeywell Information Systems Inc., Waltham, Mass.

[21] Appl. No.: 596,756

[22] Filed: Apr. 4, 1984

[51] Int. Cl.$^4$ .................... G06F 1/00; G06F 13/00
[52] U.S. Cl. ........................ 364/200; 371/11
[58] Field of Search ............. 364/200, 900; 371/11, 371/30, 47

[56] References Cited

U.S. PATENT DOCUMENTS

| | | | |
|---|---|---|---|
| 2,706,222 | 4/1955 | Bjornson | 179/18 |
| 4,145,760 | 3/1979 | Ward et al. | 365/226 |
| 4,148,099 | 4/1979 | Lauffer et al. | 365/226 |
| 4,159,516 | 6/1979 | Henrion et al. | 364/200 |
| 4,159,541 | 6/1979 | Ward et al. | 365/233 |
| 4,163,289 | 7/1979 | Schmidt | 365/51 |
| 4,168,537 | 9/1979 | Uchida | 365/154 |
| 4,198,698 | 4/1980 | Ong | 365/226 |
| 4,250,407 | 2/1981 | Dorey et al. | 307/209 |
| 4,334,268 | 6/1982 | Boney et al. | 364/200 |
| 4,375,665 | 3/1983 | Schmidt | 364/200 |
| 4,441,154 | 4/1984 | McDonough et al. | 364/200 |
| 4,443,864 | 4/1984 | McElroy | 364/900 |
| 4,500,956 | 2/1985 | Leininger | 364/200 |

OTHER PUBLICATIONS

"A Smart Dynamic Memory Needs Only Four Pins" by Don Lauffer, Electronics, Oct. 11, 1979, pp. 144–150.

Primary Examiner—Archie E. Williams, Jr.
Attorney, Agent, or Firm—Faith F. Driscoll; John S. Solakian

[57] ABSTRACT

A chip implemented in newer technology is designed to include new functionality. The chip includes compatibility circuits which connect to a pin which is unused in the chip it replaces in an existing computer system. The compatibility circuits connect to those internal parts of the new chip that contain the newly added or altered functionality. The new chip is installed in the existing computer system just as the prior chip. When so installed, the compatibility circuits enable the new chip to operate in the same manner as the replaced chip but at higher speed and with improved performance. When the new chip is installed in the system for which it was designed, the compatibility circuits enable the chip to operate with the new functionality at the same higher speed and improved performance as compared to the replaced chip.

20 Claims, 14 Drawing Figures

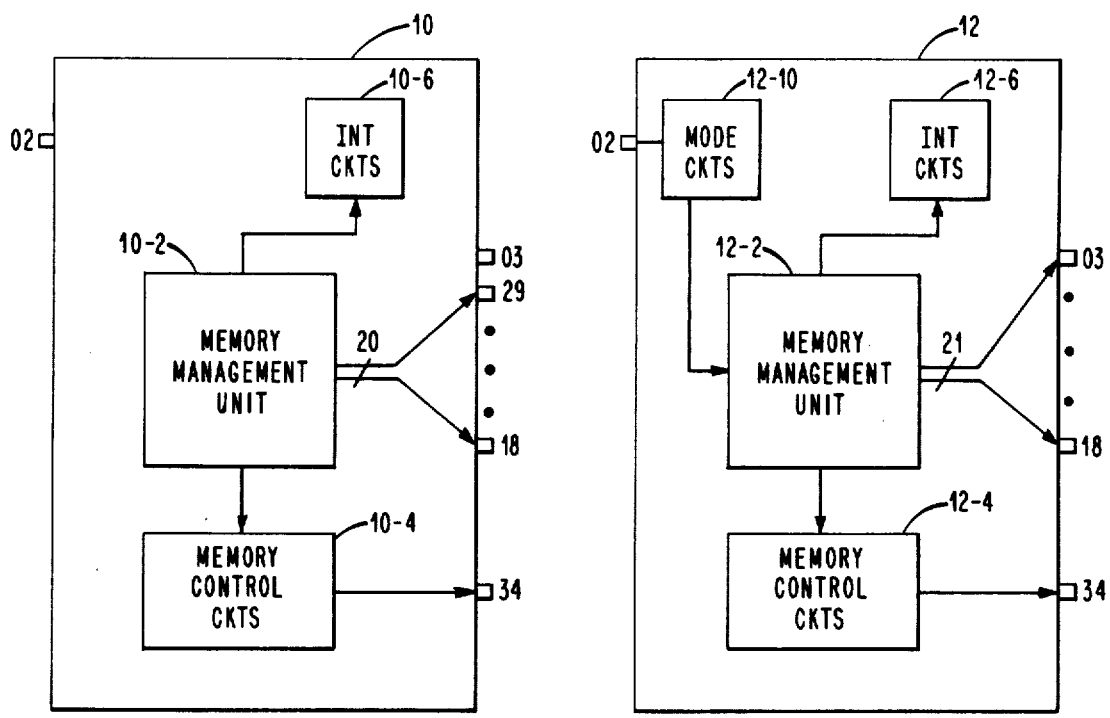
Fig. 2a.
Fig. 2b.
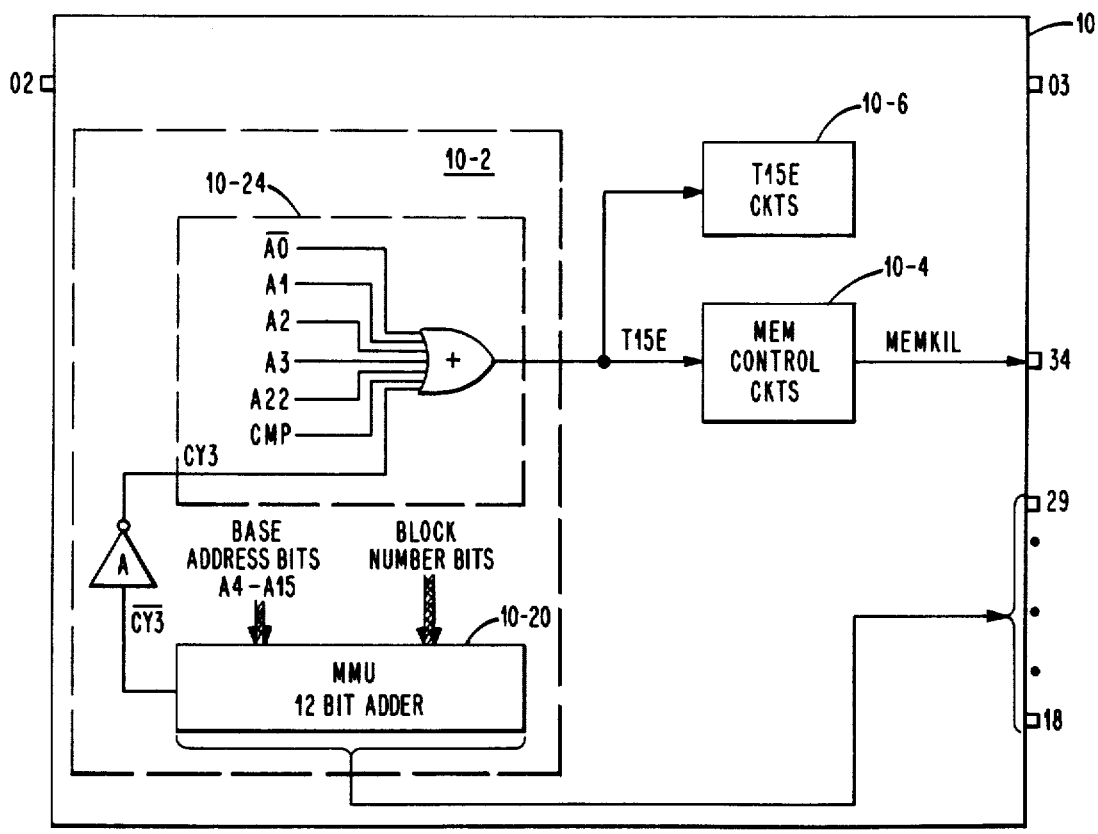
Fig. 2c.

| 0 | 1 | 3 4 | 15 16 | 17 18 | 19 20 | 21 22 23 | 31 |
|---|---|---|---|---|---|---|---|
| V | MBZ | BASE | RR | RW | RE | MBZ | SIZE |

| 0 | 1 | 2 3 | 15 16 | 17 18 | 19 20 | 21 22 23 | 31 |
|---|---|---|---|---|---|---|---|
| V | MBZ | BASE | RR | RW | RE | MBZ | SIZE |

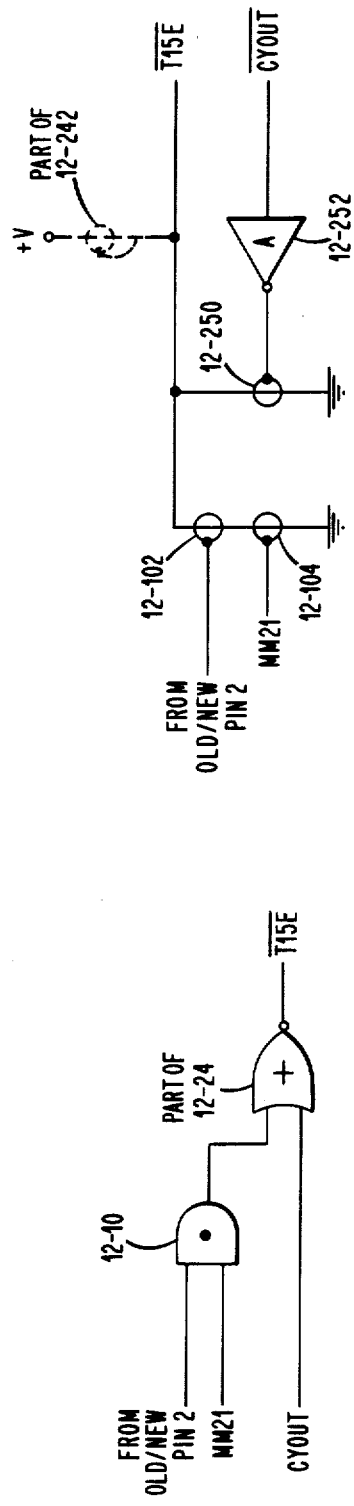

LSI MICROPROCESSOR CHIP WITH BACKWARD PIN COMPATIBILITY

BACKGROUND OF THE INVENTION

1. Field of Use

This invention relates to data processing and more particularly to microprocessor chips.

2. Background

With the significant and rapid changes in technology, manufacturers of minicomputer systems find it necessary to upgrade their systems more frequently than before. The upgrading process has taken the form of introducing new systems or retrofiting of old systems or a combination of both.

The introduction of new microprocessor chip designs has been a significant driving force in computer system upgrading. Constantly, chip manufacturers as well as some minicomputer system manufacturers are designing new chips that offer increased functionality and higher speeds. These new faster chips are in turn being made the basis of new system designs.

The chip manufacturers and computer system manufacturers have recongnized and continue to recognize the importance of compatibility between microprocessors. For example, several manufacturers of 32-bit microprocessors introduced in 1983 have emphasized their capability run software written for microprocessors that had preceded them.

For the most part, compatibility in such instances has been achieved by emulation through microprogramming, by modifying portions of the operating system, or by utilizing similar architectures. While such compatibility has been achieved, these chips are still able to provide only downward software compatibility. This means that the same software written for 8 or 16-bit microprocessor chips can be executed on 32-bit chips.

However, as chip designs continue to evolve minicomputer manufacturers still will be required to maintain inventories of those different microprocessor chips utilized in new and old minicomputer designs. That is, downward software compatibility does not require downward hardware compatibility.

In fact, the opposite is usually the case. This means that in order for an older minicomputer system to take advantage of a new chip, it is necessary to redesign or retrofit the system to accept the new chip notwithstanding the compatibilities in chip pin assignments. The reason is that the new chip besides being faster usually includes new functionality which enhances its marketability. This can prove costly in terms of both equipment maintenance and inventory.

Accordingly, it is a primary object of the present invention to provide an improved design methodology and apparatus for providing compatibility in chip designs.

It is a more specific object of the present invention to provide a chip which is usable in both new and older systems without requiring changes to be made to such older systems.

SUMMARY OF THE INVENTION

The above and other objects are achieved in a preferred embodiment of a microprocessor chip which incorporates the apparatus and methodology of the present invention. The chip implemented in large scale integration (LSI) using advanced techniques is designed to include compatibility circuits which connect to a pin which corresponds to an unused pin of the chip it is to replace in an existing computer system. The compatibility circuits connect to those internal parts of the new LSI chip that have newly added or altered functionality. When the new LSI chip is plugged into the existing minicomputer system, the compatibility circuits inhibit the operation of the added/altered functionality. At the same time, these circuits condition other parts of the chip in addition to the added functionality to the extent required to operate in the same manner as the replaced chip, but with the higher speed and improved performance attainable by the use of new technology. When the new chip is placed in the system for which it was designed, the compatibility circuits permit the chip to operate with the added functionality at the same higher speed and improved performance.

More particularly, in the preferred embodiment, the new LSI microprocessor chip employs more advanced solid state techniques (new technology) in its construction. This resulted in superior speed, improved performance, lower power consumption and simpler fabrication as compared to the prior LSI microprocessor chip. Additionally, the new chip incorporates new functionality which is reflected in an enhanced addressing capability. This is reflected in the assignment of an additional pin for another address bit. The additional pin corresponds to another unused pin of the chip being replaced. Thus, the new chip has complete hardware downward compatibility with the old chip. That is, the new chip has backward pin compatibility with the old chip.

According to the teachings of the present invention, at least part of the newly added functionality is used to provide responses required for proper operation within both new and existing systems. This reduced significantly the amount of logic circuits required to be added to the new chip. Hence, it was possible to construct the chip with little additional cost because of the small amount of extra chip area which had to be allocated to the added functionality.

Because of the above built in backward pin compatibility, the chip of the present invention can be used in two distinct systems (i.e., new and existing system designs) without having to make any changes in such systems. Thus, inventory and maintenance requirements are reduced significantly. Also, the need to retrofit existing systems to utilize the new chip has been eliminated.

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIGS. 2a, 2c and 2b, 2d, respectively, show in block diagram form, portions of the microprocessor chips of FIGS. 1a and 1b.

FIGS. 3a and 3b show the formats of segment descriptors processed by the chips of FIGS. 2a and 2b.

FIGS. 5a through 5e are tables and diagrams used to explain the construction and operation of the microprocessor chip of FIG. 4.

DESCRIPTION OF THE PREFERRED EMBODIMENT

Figure 1B:
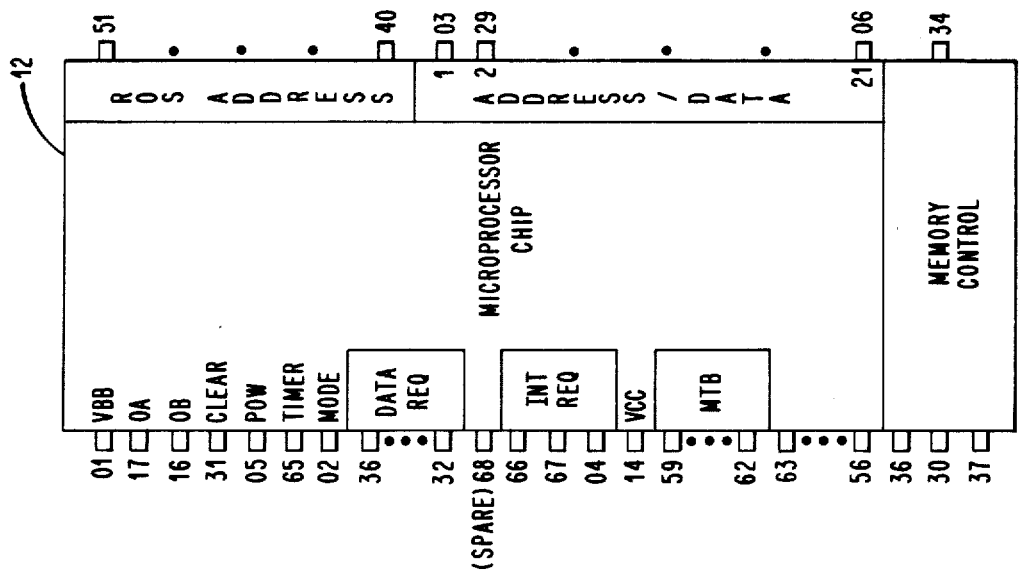
FIGS. 1a and 1b are pictorial representations of chips used to illustrate the principles of the present invention.
Figure 1A:
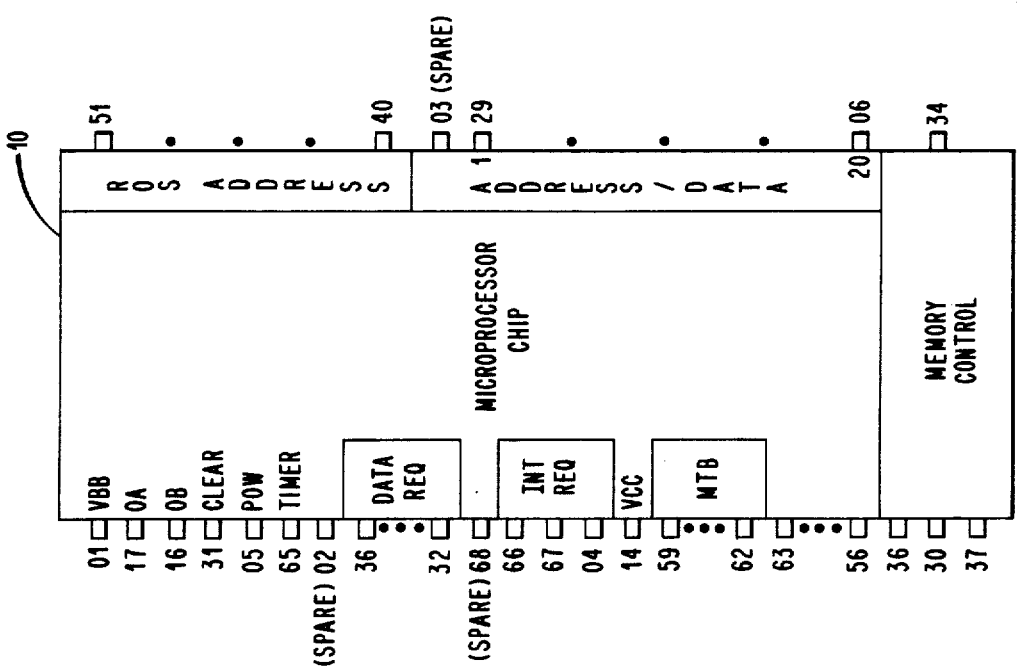

FIGS. 1a and 1b show in pictorial form the input and output pin connections of the microprocessors fabricated on single integrated circuit substrates or chips. As shown, each chip has 68 pins, several of which have no connections within the minicomputer system in which they are used. These pins are designated as spares in FIGS. 1a and 1b.

Each of the chips 10 and 12 have a number of unshared pins as for example pins 1, 14, 16, 17, 31 and 65. These pins are connected to receive supply voltages, clocking signals, timer and clear signals as shown. A second group of pins of both chips 10 and 12 connect to the address and data interface lines of the microprocessor bus. The group includes ROS address bus pins 40 through 51 and the address/data bus pins 6 through 29. As explained herein, LSI chip 12 also has pin 3 connected to the address interface lines while pin 3 of chip 10 remains unconnected in its system.

A third group of pins of chips 10 and 12 connect to the monitor/interrupt and memory management unit (MMU) circuits. The group includes data request pins 32 through 36, memory test branch pins 59 through 62, interrupt request pins 04 through 67, control input pins 56 through 63 and memory control input pins 30 through 36, in addition to a memory error violation output pin 34.

It is important to note that pins 2 and 3 of chip 10 are unconnected in its system while these same pins in chip 12 are connected in its system. Pin 2 of chip 12 is connected to receive a signal which defines in which system the chip is being used (i.e., its application in an existing or new minicomputer system). As explained herein, when chip 12 is included in an existing system, pin 2 is unconnected as in chip 10. However, when chip 12 is included in a new system, pin 2 is connected to a reference voltage such as ground. Similarly, when chip 12 is included in the existing system, pin 3 is unconnected. However, when chip 12 is included in a new system, pin 3 is connected to provide additional or expanded functionality as explained herein.

FIGS. 2a, 2c and 2b, 2d illustrate in part the organizations of chips 10 and 12. The microprocessor of chip 10 is organized to be functionally equivalent to the central processing unit described in U.S. Pat. No. 4,340,933 which issued July 20, 1982 and is assigned to the same assignee as named herein. Briefly, chip 10 includes a memory management unit MMU 10-2, the memory control circuits of block 10-4 and interrupt processing circuits of block 10-6. As seen from FIG. 2c, MMU 10-2 includes a 12-bit adder 10-20 and the error circuits of block 10-24. MMU 10-2 operates to translate 20-bit memory virtual (logical) addresses into 20-bit physical addresses utilizing segment descriptors having the format of FIG. 3a.

These descriptors are stored in a 32-bit by 31-word register file RAM. Considering the descriptor format in greater detail, it is seen that bit 0 is a validity bit. When bit 0 is a ZERO (A0=1), an OR circuit of block 10-24 signals that the segment is undefined or invalid by forcing an unavailable resource signal T15E to a ONE. The fields containing bits 1–3 and bit 22 must be all ZEROS or the MMU 10-2 signals that the segment is undefined. That is, this check is performed by OR circuit of block 10-24 forcing signal T15E to a ONE when any one of the bits A1, A2, A3 or A22 is a ONE.

Bits 4–5 constitute a 12-bit segment base which the MMU adder 10-20 adds to an 8-bit block number field (BI0-7) of the virtual or logical address applied to the address/data bus of chip 10. An unchanged offset field of the logical address is appended to the 12-bit sum applied to chip pins 29-18 to create the 20-bit physical address. When the addition results in a carry out (CY3) from adder 10-20, MMU 10-2 signals that the segment being accessed is beyond the physical size of memory. This check is performed by OR circuit of block 10-24 forcing signal T15E to a ONE when signal CY3 is a ONE.

Bits 16–21 are three 2-bit ring protection fields which define memory access rights (i.e., RR-read, RW-write and RE-execute). Since these fields are not pertinent to an understanding of the present invention, they are not discussed herein.

Lastly, bits 23–31 are a 9-bit size field for the memory segment associated with the segment descriptor. MMU 10-2 compares the size field to the 9-bit block number field to verify that the descriptor size field is equal to or greater than the bits of the block number field. When this condition is not met, signal CMP is forced to a ONE. This check is performed by OR circuit of block 10-24 forcing signal T15E to a ONE when signal CMP is a ONE. This ensures that normal access is to an available area of memory. For further details about how such checking may be accomplished, reference may be made to U.S. Pat. No. 4,378,591 issued Mar. 29, 1983 which is assigned to the same asignee as named herein.

As discussed above, during such address translation operation, MMU 10-2 performs the number of checks indicated, and generates appropriate error signals, such as signal T15E indicating whether or not memory access is legal or valid. The error signal T15E is stored one of several control flip-flops (not shown) included in MMU 10-2.

The output from this control flip-flop is applied by MMU 10-2 as appropriate trap vector signals to the interrupt processing circuits of block 10-6. The trap vector signals are processed in the manner described in U.S. Pat. No. 4,074,353, issued Feb. 14, 1978, and is assigned to the same assignee as named herein. Additionally, the same error signal T15E generated by MMU 10-2 is applied to the memory control circuits of block 10-4. These circuits in turn apply an output signal MEMKIL to pin 34 of chip 10 which is used to prevent the alteration of information stored in the memory units within the system when MMU 10-2 has detected an illegal access.

For further information regarding the chip's organization and construction, reference may be made to the copending patent application of Daniel A. Boudreau, et al., Ser. No. 509,265, entitled "Memory Architecture for Facilitating Optimum Replaceable Unit Detection and Diagnosis", filed on June 29, 1983 and to the article "The LSI-6 A 16-Bit Minicomputer Compatible Microprocessor" by John DeFalco, Peter Heslin and Ronald Springer, published in the Proceedings of The 1982 Custom Integrated Circuits Conference by the Institute of Electronic and Electrical Engineers (IEEE), Copyright, 1982.

Figures 2D, 3A, 3B:
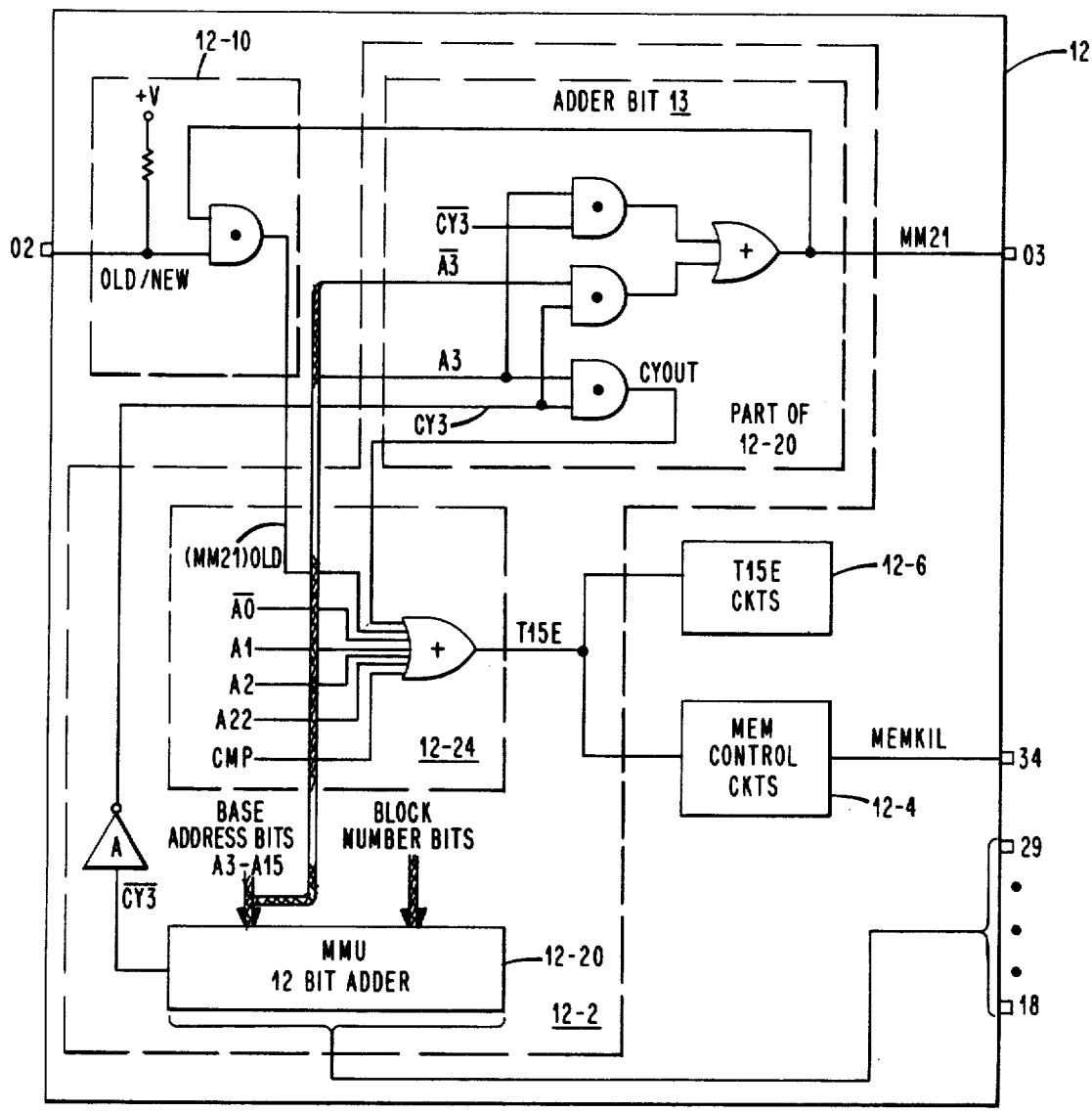

Microprocessor chip 12 is organized to have expanded and new functionality in contrast to that of the chip 10 microprocessor. As seen from FIG. 2d, MMU 12-2 includes a 13-bit adder 12-20 and the error circuits of block 12-24. MMU 12-2 operates to translate 20-bit virtual memory addresses into 21-bit physical addresses utilizing the descriptors formatted as shown in FIG. 3b.

The new (virtual) translation capability reflected by an additional address bit permits direct access to a larger segmented memory address space. That is, as seen from FIG. 3d, MMU adder 12-20 adds the 13-bit base address field of the segment descriptor to an 9-bit block number derived from the logical address applied to the chip's address bus. An unchanged offset field of the logical address is appended to the 13-bit sum applied to chip pins 3 and 29-18 to create the 21-bit physical address.

As seen from FIG. 2b, chip 12 includes the compatibility circuits of block 12-10, the memory control circuits of block 12-4 and interrupt circuits of block 12-6. The compatibility circuits of block 12-10 connect to pin 2. As explained herein, they condition the remaining circuits of MMU 12-2 of chip 12 to operate within either of two systems. That is, the circuits of block 12-10 provide the appropriate signals for conditioning the error circuits of block 12-24 and adder 12-20 to operate in either system.

It will be noted that error circuits of block 12-24 have been modified from the circuits of block 10-24. However, notwithstanding this, the OR circuit of block 12-24 has the same number of inputs as the OR circuit of block 10-24. The reason, as explained in detail herein, is that the thirteenth adder stage (new functionality) is implemented to generate signals which produce the correct error responses for either system. The signals for either system are established by the compatibility circuits of block 12-10.

As seen from FIG. 2d, address bit A3 is no longer an input to the OR circuit of block 12-24 (no longer part of the must be zero (MBZ) check. That is, address bit A3, now the most significant bit of the 13-bit descriptor base field, is an input to the last stage of adder 12-20, as shown. Also, the OR circuit receives the carry out signal CYOUT from this adder stage instead of carry out signal CY3. Lastly, the OR circuit receives the sum bit (MM21) produced by the adder stage as a function which system chip 12 is operating defined by the compatibility circuits of block 12-10.

Figure 4:
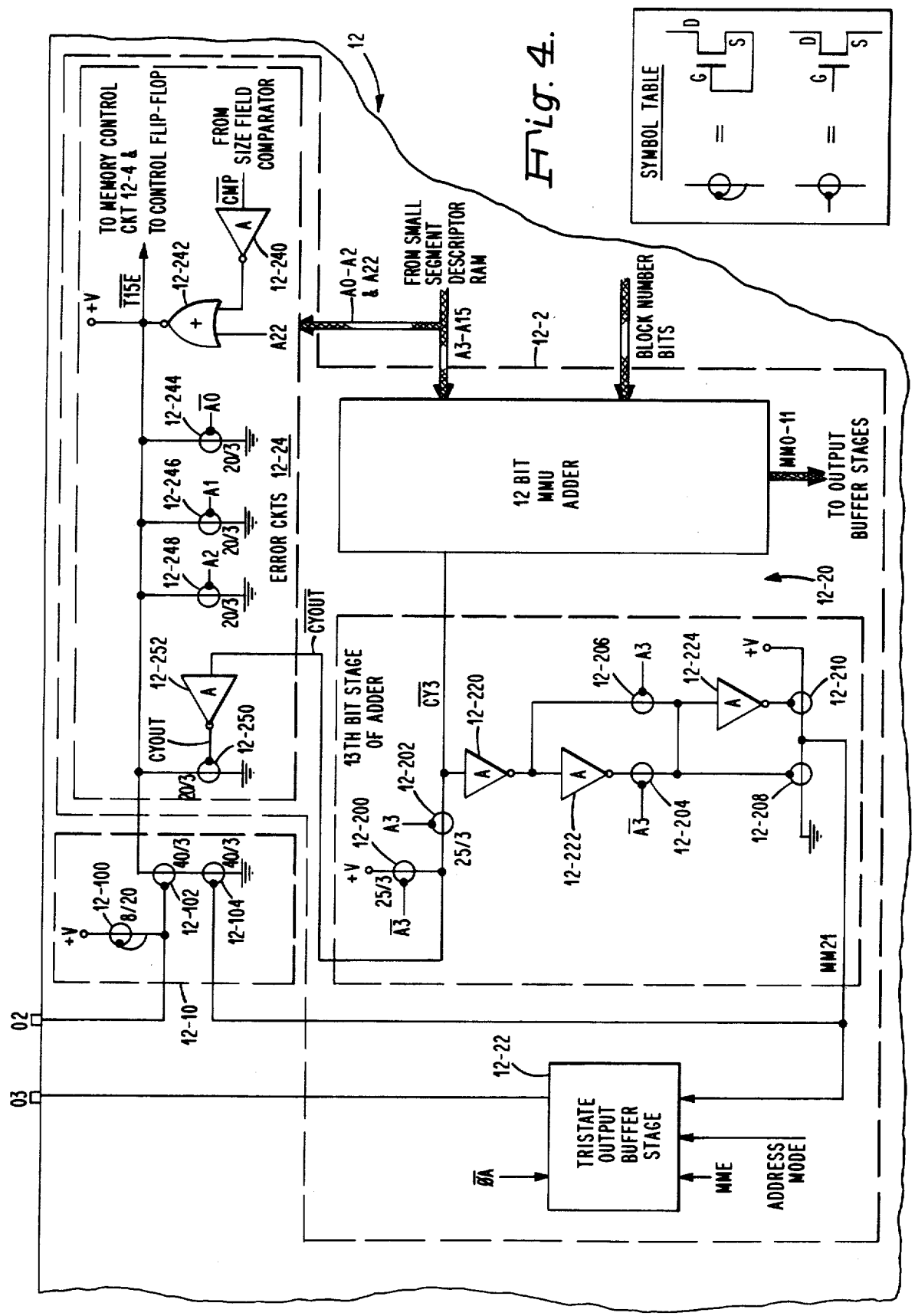
FIG. 4 shows in greater detail, portions of the chip of FIG. 2b constructed according to the principles of the present invention.

FIG. 4 shows in greater detail the different parts of chip 12 of FIG. 2 according to the present invention. These include the thirteenth stage of relocation adder 12-20 and associated output buffer stage 12-22, in addition to the compatability circuits of block 12-10 and the error circuits of block 12-24.

Each stage of the upper 4-bit positions of adder 12-20 is constructed in a manner similar to the thirteenth stage. That is, these four stages receive only bits 3–6 of the segment base descriptor while the remaining nine stages receive bits 7–15 of the segment base descriptor and the 9-block number bits which it adds together.

As seen from FIG. 4, the last stage receives as inputs, the assertion and negation of descriptor address bit 3 (i.e., A3 and $\overline{A3}$), in addition to the negation of the carry out signal from the previous stage (i.e., $\overline{CY3}$ from the twelfth stage). The sum bit MM21 generated by the thirteenth stage is applied to buffer stage 12-22 and to the compatibility circuits of block 12-10. The buffer stage 12-22 is constructed from tristate circuits, conventional in design. The circuit 12-22 applies signal MM21 to pin 3 during clocking interval $\overline{\phi A}$, when memory management unit enable signal MME is a ONE (i.e., MMU option is present) and address mode signal is a ONE (i.e., MMU performing an address translation operation).

The adder stage includes a negative exclusive OR circuit (NEOR) and an exclusive OR buffer circuit in addition to carry out circuits. In greater detail, the exclusive OR circuit and buffer circuit, respectively, are constructed from enhancement mode MOSFETS 12-204, 12-206 and 12-208, 12-210. The inverter circuits 12-220 and 12-222 are used to provide the assertion and negation of carry signal $\overline{CY3}$ for driving the NEOR. The inverter circuit 12-224 provides the negation of the sum produced by the NEOR for driving MOSFET 12-210 of the buffer circuit. The carry out circuits are constructed from enhancement mode MOSFETS 12-200 and 12-202. The shortened notation shown in the symbol table in FIG. 4 is used to represent enhancement mode MOSFETS.

Each inverter circuit can be considered conventional in design and includes a depletion mode MOSFET as a pull-up in series with an enhancement mode transistor. The width to length ratios of certain MOSFETS (e.g. MOSFETS 12-200 and 12-202) are as shown which provide the desired fast response times. For further information regarding the operation and construction of such MOSFET circuits, reference may be made to the text titled "Introduction to VLSI Systems" by Carver Mead and Lynn Conway, published by Addison-Wesley Publishing Company, Copyright, 1980.

In accordance with the teachings of the present invention, the compatibility circuits of block 12-10 include a depletion mode MOSFET 12-100 and a pair of series connected enhancement mode MOSFETS 12-102 and 12-104. As shown, MOSFETS 12-102 and 12-100 connect to pin 2 which MOSFET 12-104 connects to the sum output of adder stage thirteen. The output of MOSFET 12-102 is applied as one input to the error circuits of block 12-24. In FIG. 2d, the MOSFET 12-100 is logically represented in block 12-10 by a voltage source +V and series resistor. The MOSFETS 12-102 and 12-104 are logically represented by the AND gate.

The error circuits of block 12-24 include enhancement mode MOSFETS 12-244 through 12-250, a pair of inverter circuits 12-240 and 12-252 and a NOR circuit 12-242. The inverter circuit 12-252 together with MOSFET 12-250 force signal $\overline{T15E}$ to the appropriate state in response to carry out signal $\overline{CYOUT}$. In FIG. 2d, these circuits are logically represented by the input CYOUT to the OR circuit of block 12-24.

MOSFETS 12-244, 12-246 and 12-248, respectively, force signal $\overline{T15E}$ to the appropriate state in response to address bit signals $\overline{A0}$, A1 and A2. These transistors in FIG. 2d are logically represented by inputs $\overline{A0}$, A1 and A2.

The inverter circuit 12-240, together with NOR circuit 12-242, force signal $\overline{T15E}$ to the appropriate state in response to size comparator signal $\overline{CMP}$. Also, NOR circuit 12-242 forces signal $\overline{T15E}$ to the appropriate state in response to address bit signal A22. These circuits in FIG. 2d are logically represented by inputs CMP and A22. The NOR circuit 12-242 and inverter circuit 12-240 may take the form of the circuits described in the referenced text.

In accordance with the present invention, chip 12 is constructed from a more advanced technology than chip 10. That is, chip 12 was developed using a process which takes advantage of smaller geometries resulting in faster circuits and improved performance. More importantly, the smaller geometries provide higher yields resulting in reduced costs in manufacturing chip 12.

DESCRIPTION OF OPERATION

With reference to FIGS. 3a, 3b and 4, the methodology and operation of the present invention will now be described with particular reference to FIGS. 5a through 5e.

First, it will be assumed that chip 12 has been installed into an existing system which was designed to utilize chip 10 (hereinafter old system). In this case, pins 2 and 3 of chip 12 of FIG. 4 are unconnected. Therefore, the compatibility signal provided by the circuits of block 12-10 and applied to MOSFET 12-102 is at approximately voltage V representative of a binary ONE. Therefore, signal $\overline{T15E}$ will change state as a function of address bit 13 (i.e., MMU12) which corresponds to the sum of segment descriptor bit 3 (A3) and the carry out ($\overline{CY3}$) from adder stage twelve.

The compatibility circuits of block 12-10 and adder stage thirteen were implemented to minimize the amount of added circuits so that the new functionality could be included within the available area. This was achieved by utilizing the circuits of adder stage thirteen to provide the correct error responses for both existing (old) and new systems.

FIGS. 5a through 5e illustrate how the above is achieved. The response requirement of the chip 10 is set forth in FIG. 5a. In order for a segment descriptor to be valid in the old system, segment descriptor bit 3 (A3) must equal ZERO. In addition, there should be no carry out (CY3) from adder stage twelve. Thus, according to the table of FIG. 5a, chip 10 forces unavailable resource signal $\overline{T15E}$ to a binary ZERO when either carry out signal CY3 or segment descriptor bit A3 is a ONE.

FIG. 5b is a table illustrating the error responses of FIG. 5a when carried out by chip 12. It can be seen from FIG. 5b that unavailable resource signal $\overline{T15E}$ is forced to a binary 0 whenever there is a carry out (i.e., CYOUT) from the thirteenth stage, or the high order address bit 21 (i.e., MM21) generated by the MMU adder 12-2 is a binary ONE. It should be noted that MM21 and CYOUT are only a function of their inputs CY3 and A3.

The above can be expressed in terms of the following Boolean equation: $T15E = CY3 \cdot A3 + (A3 \cdot \overline{CY3} + \overline{A3} \cdot CY3)$. However, it is seen from the table of FIG. 5b that $CY3 \cdot A3 = CYOUT$ while $A3 \cdot \overline{CY3} + \overline{A3} \cdot CY3 = MM21$. Therefore, $T15 = CYOUT + MM21$. Please note that the symbols · and + are used to denote AND and OR operations, respectively.

FIG. 5c expresses the error responses of FIG. 5b in terms of the compatibility signal applied to pin 2 and the carry out (CYOUT) and sum output (MM21) generated by adder stage thirteen. As seen from the table of FIG. 5c, T15E (old system)=OLD (CYOUT+MM12). T15E (new system)=$\overline{OLD}$ (CYOUT). Therefore, T15E (old system and new system)=OLD (CYOUT+MM21)+$\overline{OLD}$ (CYOUT)=OLD (CYOUT)+OLD·MM12+OLD·CYOUT=CYOUT (OLD +$\overline{OLD}$)+OLD·MM12=OLD·MM12 +CYOUT=(OLD/NEW) MM21+CYOUT.

The responses of the table of FIG. 5c are provided by the logic network of FIG. 5d which corresponds to the MOSFET circuits of FIG. 5e. Now referring to FIG. 2d, it is seen that when chip 12 is used in existing or currently designed (OLD) systems, pins 2 and 3 are unused and therefore remain unconnected. Thus, a binary ONE is applied to the AND gate of block 12-10 of FIG. 2d which is labeled as 12-10 in FIG. 5d. The segment descriptor bit A3 and the carry out CY3 are factored into error function T15E as follows:

$$T15E = MM21 \cdot OLD + CYOUT =$$

$$T15E = (A3 \cdot \overline{CY3} + \overline{A3} \cdot CY3) \cdot OLD + A3 \cdot CY3;$$

$$T15E = A3 \cdot \overline{CY3} \cdot OLD + \overline{A3} \cdot CY3 \cdot OLD + A3 \cdot CY3;$$

$$T15E = A3 \cdot \overline{CY3} \cdot OLD + \overline{A3} \cdot CY3 \cdot OLD + A3 \cdot CY3 \cdot OLD + A3 \cdot CY3 \cdot \overline{OLD};$$

$$T15E = A3 \cdot OLD + CY3 \cdot OLD + A3 \cdot CY3;\ \text{and,}$$

$$T15E = OLD(A3 + CY3) + A3 \cdot CY3.$$

When chip 12 is used in the new designed systems (NEW), pins 2 and 3 are connected within such systems. That is, pin 2 is grounded while pin 3 connects to the address/data buses of such systems. When pin 2 is grounded, sum bit MM21 is no longer a part of the error function T15E. It is now the most significant address bit of the 13-bit base field of the selected segment descriptor. That is, as seen from FIG. 2d, MM21 is the exclusive OR of signals CY3 and A3. Also, in the new system, error function T15E = A3·CY3 = CYOUT consistent with the requirements of the table of FIG. 5c.

As seen from FIG. 2d, the sum bit signal MM21 is applied to pin 3 which is now the most significant bit of the new 21-bit physical address provided by MMU 12-2. All other pins of chip 12 remain unchanged as to the functions they perform within the system (i.e., signal MEMKILL which prevents memory access in the case of memory write operations, remains connected to pin 34).

From the above, it is seen how the present invention enables chip 12 to operate within two systems having different functionality with little added circuits. The invention makes it possible to utilize chips developed with new technology at lower cost to be utilized in older systems without requiring any changes to be made to such systems. Thus, the invention permits the older systems to operate with newer chips with the attendant speed and cost advantages and no change to system functionality or operation.

It will be obvious to those skilled in the art that many changes may be made to the preferred embodiment without departing from the teachings of the present invention. For example, the invention is not limited as to a particular type of chip organization, functionality or technology.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. An integrated circuit microprocessor chip developed using an advanced technology and designed for use in a first one of a plurality of computer systems, said chip comprising:
- a plurality of external pins;
- a plurality of functional sections interconnected to each other for performing processing operations, at least one of said functional sections providing functionality not found in a second one of said systems, said one functional section being coupled to one of said plurality of external pins which is unused in said second one of said systems; and,
- compatibility means connected to said one functional section, to other ones of said sections and to another one of said external pins which is unused in said second system, said compatibility means when said chip is included in said second system, disabling said one functional section by conditioning other ones of said sections to operate in said second system in the same manner as the chip it replaced at high speed and performance attained by using said advanced technology.

2. The chip of claim 1 wherein said compatibility means when said chip is included in said first system enables said one functional section by conditioning other ones of said sections to operate with said new functionality.

3. The chip of claim 1 wherein said one functional section is a memory management section for translating virtual addresses into physical addresses and which provides an increased physical address space.

4. The chip of claim 3 wherein said memory management section connects to said one external pin for receiving and generating an additional address bit to provide said increased physical address space.

5. The chip of claim 2 wherein said other ones of said sections includes an error detection section coupled to said compatability means and to said one functional section, said error detection section being operative to generate an output signal indicating an illegal access under either first or second sets of conditions selectable by said compatibility means as a function of which system said chip is being operated.

6. The chip of claim 5 wherein said other ones of said sections include a memory control section, said memory control section being coupled to said compatibility means and to one of said external pins used for preventing the addressing of an unavailable resource, said error detection section conditioning said memory control section to generate signals according to said unavailable resource signals received from said error detection section.

7. The chip of claim 5 wherein said compatibility means includes:
- a voltage source and gating means having at least a pair of input terminals and an output terminal one of said input terminals being connected to said one external pin in common with said voltage source, the other one of said input terminals being connected to an output of said one functional section, and said output terminal being connected to said error detection section, said gating means being enabled when chip is installed in said second system to condition said error detection section to generate said output signal in response to signals representative of said first set of conditions and said gating means being disabled when said chip is installed in said first system to condition said error detection section to generate said output signal in response to signals representative of said second set of conditions.

8. The chip of claim 7 wherein said one functional section includes an adder and said output corresponds to the most significant bit of said adder, said adder being connected to apply a carry out signal to said error detection section, said gating means when enabled applying said most significant bit together with said carry out signals representative of said first set of conditions and said gating means when disabled inhibiting the application of said most significant bit representative of said second set of conditions.

9. The chip of claim 8 wherein said gating means includes an AND gate and said chip is implemented with MOSFETS using advanced technology for said higher speed and performance.

10. An integrated circuit chip developed using an advanced technology which produces high performance and lower cost for use in new and existing computer systems, said chip comprising:
- a plurality of external pins;
- a plurality of functional sections interconnected to each other for performing processing operations, at least one of said functional sections providing functionality not found in said existing system, said one functional section being coupled to one of said external pins which is unused in said existing system; and,
- compatibility means connected to said one functional section, to other ones of said sections and to another one of said external pins which is unused in said existing systems, said compatibility means when said chip is installed in one of said existing system without change, disabling said one functional section by conditioning other ones of said sections to generate the same responses in said existing system as the previously installed chip and provide said higher performance and lower cost by using said advanced technology.

11. The chip of claim 10 wherein said compatibility means when said chip is installed in said new system enables said one functional section by conditioning other ones of said sections to operate with said new functionality.

12. The chip of claim 10 wherein said one functional section is a memory management section for translating virtual addresses into physical addresses with increased physical address space.

13. The chip of claim 12 wherein said memory management section couples to said one external pin for receiving and generating an additional address bit to provide said increased physical address space.

14. The chip of claim 11 wherein said other ones of said sections includes an error detection section coupled to said compatibility means and to said one functional section, said error detection section being operative to generate an unavailable resource signal indicating an illegal access under either first or second sets of conditions under the control of said compatibility means as a function of which system said chip is being used.

15. The chip of claim 14 wherein said other ones of said sections include a memory control section, said memory control section being coupled to said compatibility means and to one of said external pins used for preventing the addressing of an unavailable resource, said error detection section conditioning said memory control section to generate signals according to signals applied to said error detection section under the control of said compatibility means.

16. The chip of claim 14 wherein said compatibility means includes:
a voltage source and gating means having at least a pair of input terminals and an output terminal one of said input terminals being connected to said one external pin in common with said voltage source, the other one of said input terminals being coupled to said one functional section, and said output terminal being connected to said error detection section, said gating means being enabled when chip is installed in one of said existing systems to condition said error detection section to generate said unavailable resource signal in response to signals representative of said first set of conditions and said gating means being disabled when said chip is installed in said new system to condition said error detection section to generate said unavailable resource output signal in response to signals representative of said second set of conditions.

17. The chip of claim 16 wherein said one functional section includes an adder and an output terminal coupled to said compatibility means for applying the most significant bit of a sum generated by said adder, said adder being connected to apply a carry out signal to said error detection section, said gating means when enabled applying said most significant bit together with said carry out signals representative of said first set of conditions and said gating means when disabled inhibiting the application of said most significant bit representative of said second set of conditions.

18. The chip of claim 17 wherein said gating means includes an AND gate and said chip is implemented with MOSFETS using said advanced technology to achieve said higher speed and performance.

19. A method of constructing an integrated circuit microprocessor chip constructed using new technology with new functionality for utilization in a newly designed system to have backward pin compatibility with an earlier designed integrated circuit microprocessor chip designed for use in a first computer system not containing said new functionality, said method comprising the steps of:
providing at least two external pin terminals unused in said earlier system which are to be connected in a system designed to utilize said new functionality;
providing a plurality of functional units interconnected to perform processing operations, at least one of said units being constructed to provide said new functionality;
connecting said one functional unit to one of said two external pin terminals;
connecting compatibility means to the other one of said external pin terminals, to said one functional unit and to another one of said functional units; and,
constructing said compatibility means to generate a disabling signal when said chip is installed in said first system without any change for inhibiting said new functionality by enabling said another one of said functional units to provide responses identical to said earlier designed chip for operation within said first computer system at the higher speed and performance attained by using said new technology.

20. The method of claim 19 wherein said step of constructing said compatibility means further includes the steps of:
including a voltage source and logic means in said compatibility means;
connecting an input of said logic means to said one functional unit and an output of said logic means to said another one of said functional units; and,
connecting said voltage source to said other one of said external pin terminals in common with an input of said logic means so that when said chip is installed in said first computer system, said voltage source enables said gating means to generate said disabling signal and said voltage source is disabled when said chip is installed in said newly designed system.

* * * * *